(12) United States Patent
Altemose

(10) Patent No.: US 11,149,738 B2
(45) Date of Patent: Oct. 19, 2021

(54) CONTROL SYSTEMS AND METHODS FOR SYNCHRONIZING COOLING FANS

(71) Applicant: ROCKWELL COLLINS, INC., Cedar Rapids, IA (US)

(72) Inventor: George Altemose, Setauket, NY (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 582 days.

(21) Appl. No.: 15/612,852

(22) Filed: Jun. 2, 2017

(65) Prior Publication Data
US 2018/0347575 A1 Dec. 6, 2018

(51) Int. Cl.
| F04D 27/00 | (2006.01) |
| H03L 7/08 | (2006.01) |
| F04D 25/16 | (2006.01) |
| H03L 7/099 | (2006.01) |

(52) U.S. Cl.
CPC ......... *F04D 27/004* (2013.01); *F04D 25/166* (2013.01); *H03L 7/08* (2013.01); *H03L 7/099* (2013.01)

(58) Field of Classification Search
CPC ........ H02P 7/293; F04D 27/004; F04D 27/00; F04D 25/166; H03L 7/08; H03L 7/099
USPC .......................... 318/85; 417/2, 426; 327/3, 4
See application file for complete search history.

(56) References Cited

U.S. PATENT DOCUMENTS

| 3,430,148 | A | * | 2/1969 | Eiji | ...................... | H03D 13/004 |
| | | | | | | 327/3 |
| 3,789,280 | A | * | 1/1974 | Oldfield | .................... | H02P 5/68 |
| | | | | | | 318/45 |
| 6,428,282 | B1 | * | 8/2002 | Langley | ................. | F04D 27/004 |
| | | | | | | 417/2 |
| 2005/0046362 | A1 | * | 3/2005 | Ma | ......................... | F04D 25/166 |
| | | | | | | 318/77 |
| 2010/0013307 | A1 | * | 1/2010 | Heineman | ............... | H02J 1/001 |
| | | | | | | 307/33 |
| 2012/0244015 | A1 | * | 9/2012 | Benson | .................. | F04D 25/166 |
| | | | | | | 417/53 |
| 2013/0315727 | A1 | * | 11/2013 | Ho | ........................ | F04D 25/166 |
| | | | | | | 415/213.1 |

(Continued)

OTHER PUBLICATIONS

Fundamentals of Phase Locked Loops (PLLs), MT-086 Tutorial, Analog Devices, 2009, pp. 1-10.

*Primary Examiner* — Charles G Freay
*Assistant Examiner* — Chirag Jariwala
(74) *Attorney, Agent, or Firm* — Suiter Swantz pc llo

(57) ABSTRACT

In an illustrative embodiment, a control system to synchronize a number of slave fans to a master fan may include a master voltage controlled oscillator to receive input voltages, rotate master blades of the master fan pursuant to the input voltages, and provide reference synchronization signals; a slave voltage controlled oscillator to receive the input voltages modified by a gain, rotate slave blades of the slave fan at slave fan speed pursuant to the input voltages, and provide slave synchronization signals; and a phase lock loop configured to receive the reference synchronization signals and the slave synchronization signals, provide a comparison between the reference slave synchronization signals, and provide the gain pursuant to the comparison between the reference synchronization signals and the slave synchronization signals.

18 Claims, 6 Drawing Sheets

(56) References Cited

U.S. PATENT DOCUMENTS

2018/0316290 A1* 11/2018 Hanseler .................. H02P 6/08
2020/0063741 A1* 2/2020 Lechner .................. F04D 13/14

* cited by examiner

CONTROL SYSTEMS AND METHODS FOR SYNCHRONIZING COOLING FANS

BACKGROUND

Electronic circuits such as integrated circuit chips, microprocessors, graphic cards, and hard disk drives, can generate a large amount of heat which needs to be extracted from the electronic circuits. In order to cool down the electronic circuits and thereby reduce the probability of failure of these components, cooling systems have been adopted. Usually these cooling systems rely on conventional systems controlling a multitude of fans to force ambient air through a housing containing the electronic circuits, which often are adjacent to fins or other structural members to increase the surface area and enhance the transfer of heat from the electronic circuits to the ambient air.

Although such conventional systems are widely used, they present important drawbacks. Notably, the multitude of fans may run at desynchronized speeds which cause a variety of problems. For example, undesirable noise containing beat frequencies can be generated by different speeds between each fan of the multitude of fans. In addition, the speed difference between each fan can produce undesirable conductive emissions that can generate interferences with other electrical elements and/or parts of the electrical circuits.

Thus, an electronic system solving the aforementioned limitations of desynchronization is desired.

SUMMARY OF ILLUSTRATIVE EMBODIMENTS

The forgoing general description of the illustrative implementations and the following detailed description thereof are merely exemplary aspects of the teachings of this disclosure, and are not restrictive.

In one aspect, the object of the present disclosure is to provide a system to synchronize a set of cooling fans which overcomes the above-mentioned limitation of desynchronization. The control systems of the present disclosure may provide synchronization by implementing a master-slave coupling between a multitude of slave fans to a master fan via a frequency lock status and a phase lock loop status.

In a general sense, illustrative embodiments described herein overcome differences between fan units, forcing multiple fans to rotate at a same speed through setting a master fan to a master voltage corresponding to a master speed, and then varying the voltage of at least one other (slave) fan until the two fans synchronize. The slave fan(s) may be supplied a higher or lower voltage than the input voltage of the master fan during synchronization.

In one non-limiting illustrative example, a control system to synchronize a slave fan to a master fan is presented. The control system may include a master voltage controlled oscillator configured to receive input voltages, rotate master blades of the master fan pursuant to the input voltages, and provide reference synchronization signals; a slave voltage controlled oscillator configured to receive the input voltages, rotate blades of the slave fan at a speed pursuant to the input voltages, and provide slave synchronization signals; and a phase lock loop configured to receive the reference synchronization signals and the slave synchronization signals, provide a comparison between the reference synchronization signals and the slave synchronization signals, and provide the gain pursuant to the comparison between the reference synchronization signals and the slave synchronization signals, where the gain modifies the input voltages to rotate the slave blades at a slave fan speed substantially and/or exactly equal to the master fan speed.

In another non-limiting illustrative example, a control system to synchronize a number of slave fans to a master fan includes a temperature sensor and a temperature controller configured to provide input voltages pursuant to ambient air temperature; a master voltage controlled oscillator configured to receive the input voltages, rotate master blades of the master fan at a master fan speed pursuant to the input voltages, and provide reference synchronization signals from the master fan; a number of slave voltage controlled oscillators, where each slave voltage controlled oscillator of the number of voltage controlled oscillators is configured to receive the input voltages, rotate respective slave blades of a respective slave fan of the number of slave fans pursuant to the input voltages, and provide respective slave synchronization signals from the respective slave fan; and a number of phase lock loops, where a respective phase lock loop of the number of phase lock loops is configured to receive the reference synchronization signals and the respective slave synchronization signals, provide a comparison between the reference synchronization signals and the respective slave synchronization signals, and provide the respective gain pursuant to the comparison between the reference synchronization signals and the respective slave synchronization signals, where each respective gain modifies respective input voltages of the respective slave voltage controlled oscillator of the number of slave voltage controlled oscillators to rotate the respective slave blades at a respective slave fan speed substantially and/or exactly equal to the master fan speed.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying graphs and figures are for illustration purposes only and may or may not represent actual or preferred values or dimensions. Where applicable, some or all features may not be illustrated to assist in the description of underlying features. In the drawings.

DETAILED DESCRIPTION OF ILLUSTRATIVE EMBODIMENTS

The description set forth below in connection with the appended drawings is intended as a description of various embodiments of the disclosed subject matter and is not necessarily intended to represent the only embodiments. In certain instances, the description includes specific details for the purpose of providing an understanding of the disclosed embodiments. However, it will be apparent to those skilled in the art that the disclosed embodiments may be practiced without those specific details. In some instances, well-known structures and components may be shown in block diagram form in order to avoid obscuring the concepts of the disclosed subject matter.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments. Further, it is intended that embodiments of the disclosed subject matter cover modifications and variations thereof.

It must be noted that, as used in the specification and the appended claims, the singular forms "a," "an," and "the" include plural referents unless the context expressly dictates otherwise. That is, unless expressly specified otherwise, as used herein the words "a," "an," "the," and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein merely describe points of reference and do not necessarily limit embodiments of the present disclosure to any particular orientation or configuration. Furthermore, terms such as "first," "second," "third," etc., merely identify one of a number of portions, components, steps, operations, functions, and/or points of reference as disclosed herein, and likewise do not necessarily limit embodiments of the present disclosure to any particular configuration or orientation.

Furthermore, the terms "approximately," "proximate," "minor," and similar terms generally refer to ranges that include the identified value within a margin of 20%, 10% or preferably 5% in certain embodiments, and any values therebetween.

Figure 1A:
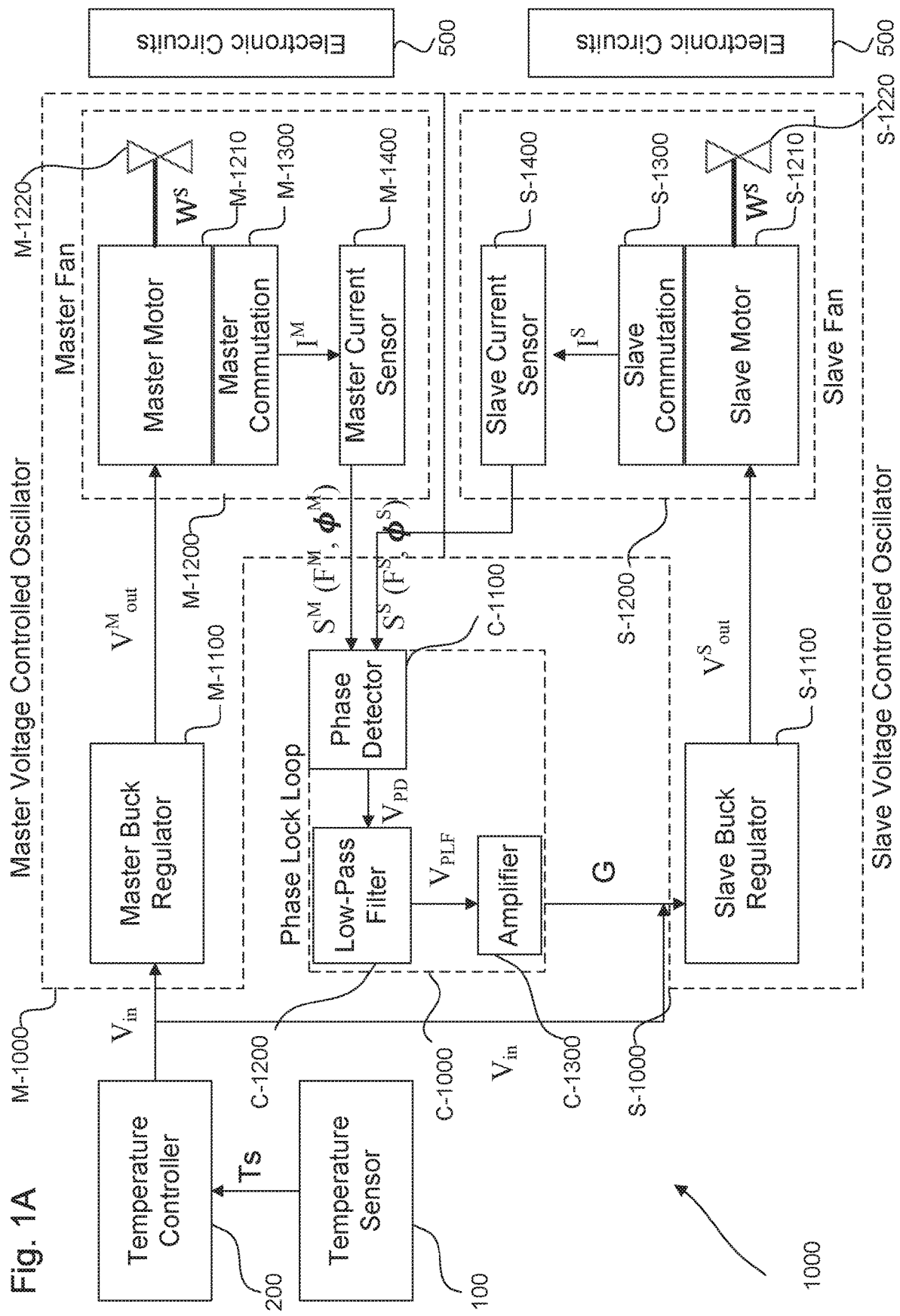
FIG. 1A is a schematic view of an example control system with a master fan and a slave fan, according to certain aspects of the disclosure.
Figure 1B:
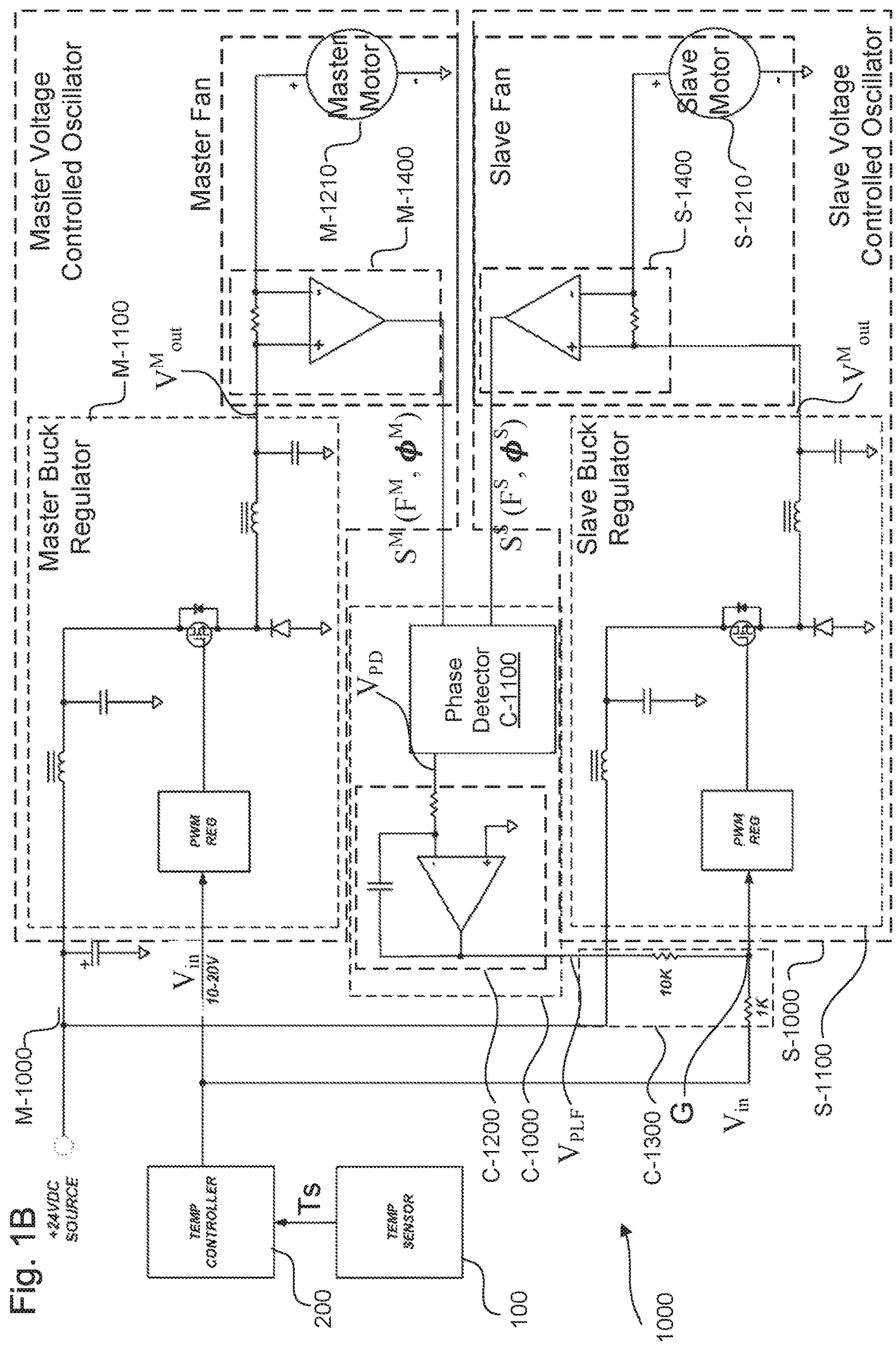
FIG. 1B is a hardware diagram view of an example control system with the master fan and the slave fan, according to certain aspects of the disclosure.
Figure 1C:
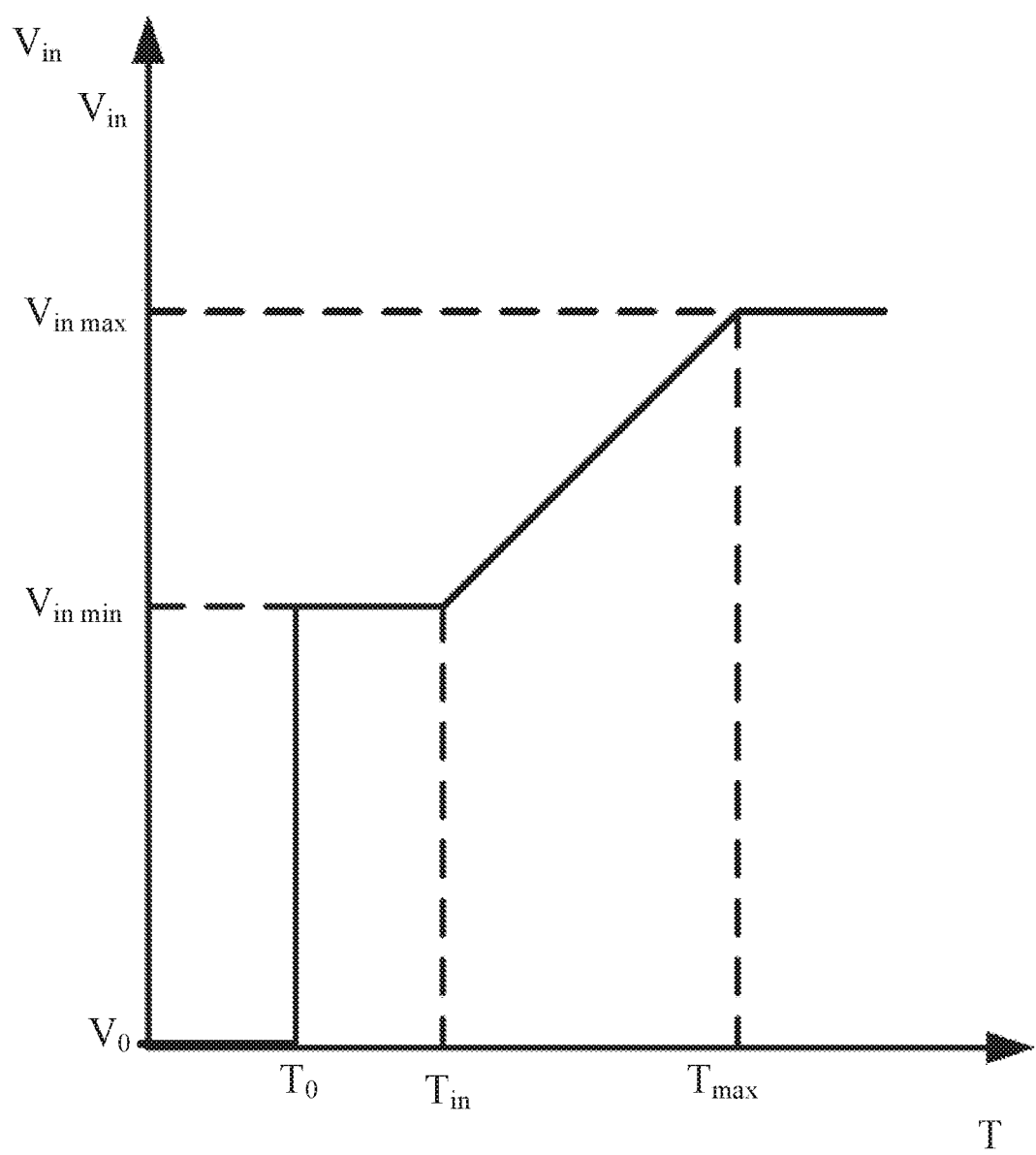
FIG. 1C is a graph of example input voltages of a master fan as a function of air temperatures, according to certain aspects of the disclosure.

Referring now to FIGS. 1A-1C, a control system 1000 to synchronize a slave fan S-1200 to a master fan M-1200 is illustrated. The master fan M-1220 and the slave fan S-1220, as illustrated in FIG. 1A, are provided to cool electronic circuits 500 in synchronization.

Turning to FIG. 1A, a schematic diagram illustrates the control system 1000 including a master voltage controlled oscillator M-1000 to receive input voltages $V_{in}$, to rotate master blades M-1220 of a master fan M-1200 and to cool electronic circuits 500. The master voltage controlled oscillator M-1000 further may provide reference synchronization signals $S^M$ to synchronize rotation with one or more slave fans, such as a slave voltage controlled oscillator S-1000. The control system 1000 may synchronize the master voltage controlled oscillator M-1000 with the slave voltage controlled oscillator S-1000 via a phase lock loop C-1000. The phase lock loop C-1000, for example, may compare the reference synchronization signals $S^M$ with the slave synchronization signals $S^S$ and provide a gain G to modify the slave synchronization signals $S^S$ in order to match the slave synchronization signals $S^S$ with the reference synchronization signals $S^M$. Matching the slave synchronization signals $S^S$ with the reference synchronization signals $S^M$ synchronizes the rotation of the master blades M-1220 with the rotation of the slave blades S-1220 which in turn may limit the level of noise and/or emissions generated by the master fan M-1200 and the slave fan S-1200. The phase lock loop C-1000, in an illustrative example, includes a frequency comparator and an integrator. Where the input frequency is lower than a reference frequency, the output voltage of the integrator will increase. If the input frequency is instead greater than the reference frequency, the output voltage of the integrator will decrease. In this manner, the phase lock loop C-1000 works to adjust the slave input voltage based upon sensed frequency of rotation.

The slave voltage controlled oscillator S-1000 may provide slave synchronization signals $S^S$ to the phase lock loop C-1000. Using the reference synchronization signals $S^M$ and the slave synchronization signals $S^S$, the phase lock loop C-1000 may produce the gain G. In operation, the slave voltage controlled oscillator S-1000 may receive the input voltages $V_{in}$ adjusted by the gain G to rotate slave blades S-1220 of the slave fan S-1200.

In some implementations, the control system 1000 is capable of maintaining performance of functioning oscillators (e.g., the master voltage controlled oscillator M-1000 and/or the slave voltage controlled oscillator S-1000) despite failure of a system oscillator. In some examples, a seized up motor or burnt electrical element could render an oscillator inoperable or cause performance to deteriorate. For example, if a control voltage for the control system 1000 is established primarily by a temperature controller, with only small adjustments supplied by the phase lock loop C-1000, without feedback signals the fans will continue to function at the nominal voltage. In the circumstance of multiple slave fans (e.g., multiple remaining fans), while this partial failure mode can cause a return of the problems of beat frequencies and/or current spikes, there will be no actual failure of the performance of the control system 1000 in maintaining cooling although some degradation can occur due to the reduction in number of cooling fans.

In some embodiments, the control system 1000 manages fan oscillation speed based in part upon sensed temperatures (e.g., a temperature indicative of conditions of the apparatus or circuitry cooled by the master fan and slave fan(s)). For example, the control system 1000 may include a temperature sensor 100 to provide temperature signals Ts indicative of ambient air temperatures T. A temperature controller 200 may receive the temperatures signals Ts from the temperature sensor 100 and provide input voltages $V_{in}$ driving a rotational speed $W^M$ of the master fan M-1200 based on the ambient air temperature Ts.

Referring now to FIG. 1C, an example predetermined temperature-voltage relationship between the ambient air temperature T and input voltages $V_{in}$ as may be generated by the temperature controller 200 is illustrated. The temperature-voltage relationship of FIG. 1C is for illustrative purposes and can be adjusted based upon the needs of individual systems.

In some embodiments, if the ambient air temperature T is below a first predetermined minimum temperature threshold $T_0$, the temperature controller 200 generates a substantially null voltage $V_0$. This setting allows the control system 1000 to conserve energy and reduce wear in system components by deactivating cooling.

In some embodiments, when the ambient air temperature T rises above the first predetermined minimum temperature threshold $T_0$ but remains below a predetermined intermediate temperature threshold $T_{in}$, the temperature controller 200 may generate a minimum voltage $V_{in\ min}$ to set the rotational speed $W^M$ at a first (e.g., low) setting, providing low energy consumption cooling and minimizing noise generation. For example, the first predetermined minimum temperature threshold $T_0$ can be between 10° C. and 30° C., or preferably between 15° C. and 25° C. for maintaining proper temperature of microelectronic circuitry. The minimum voltage $V_{in\ min}$ can between 5V and 15V, and preferably between 7.5V and 12.5V.

As illustrated, in some embodiments upon exceeding the intermediate temperature threshold $T_{in}$, the temperature controller 200 may generate a voltage above $V_{in\ min}$ that increases relative to (e.g., proportionate to) ambient temperature until a maximum temperature $T_{max}$ is reached. For example, fan speed may be adjusted across a range of intermediate speeds as temperature increases from $T_{in}$ to $T_{max}$. The intermediate temperature threshold $T_{in}$, for example, can be between 20° C. and 40° C., and preferably between 25° C. and 35° C.

If the ambient air temperature T exceeds a predetermined maximum temperature threshold $T_{max}$, in some embodiments, the temperature controller 200 generates a maximum voltage $V_{in\ max}$ to maximize the rotational speed $W^M$ of the master fan M-1200 and thus maximize cooling. The predetermined maximum temperature threshold $T_{max}$ can be between 40° C. and 60° C., for example, and preferably between 45° C. and 55° C. The maximum voltage $V_{in\ max}$ can between 15V and 25V, and preferably between 17.5V and 22.5V.

Returning to FIG. 1, the master voltage controlled oscillator M-1000 can include a master fan regulator M-1100 to receive the input voltages $V_{in}$ and to provide master output voltages $V^M_{out}$. The master fan regulator M-1100, for example, may be a buck regulator. The master fan M-1200 may then receive the master output voltages $V^M_{out}$ and to provide the reference synchronization signal $S^M$.

In some embodiments, the master fan M-1200 includes a master fan motor M-1210 to receive the master output voltages $V^M_{out}$ and to drive the master blades M-1220 at the master rotational speed $W^M$. A master commutation system M-1300 may provide master current pulses $I^M$, generated by the master fan motor M-1210 to a master current sensor M-1400. In turn, the master current sensor M-1400 may receive the master current pulses $I^M$ and extract reference synchronization signals $S^M$ (e.g., a reference synchronization phase $\phi^M$ and/or a reference synchronization frequency $F^M$) from the master current pulses $I^M$. The master current sensor may then provide the reference synchronization signals $S^M$ to a coupling system for synchronizing one or more slave fans of a slave fan assembly. In some implementations, the reference synchronization frequency $F^M$ is indicative of the master rotational speed $W^M$ of the master blades M-1220, (e.g. proportional to the master rotational speed $W^M$) while the reference synchronization phase $\phi^M$ can be indicative of a phase angle of the master blades M-1220. For example, the slave fan assembly may include one or more slave fans S-1000 having a different blade configuration than the master blades M-1220, thus requiring a different operational frequency than the master blades M-1220. The reference synchronization signals $S^M$, in one example, can be a square wave signal with a frequency of the reference synchronization frequency $F^M$ and a phase of the reference synchronization phase $\phi^M$, as illustrated in FIG. 1B.

The configuration of the master fan motor M-1210 may vary. For example, the master fan motor M-1210 can be a direct current electrical motor such as a DC brushed motor or a DC brushless motor. In other embodiments, the master fan motor M-1210 is an induction motor or a synchronous motor. In a preferred embodiment, the master fan motor M-1210 is a brushless DC motor for the features of high efficiency, small size, and wide speed range. Brushless DC motors are commonly found in use as electronic equipment cooling fans, providing the opportunity to retrofit the synchronous fan controller to preexisting systems. In some implementations, the master fan motor M-1210 can include a stator with coils, a rotor with permanent magnets driven by the coils of the stator, and a shaft affixed to the rotator and supporting the master blades M-1220. In such a configuration, the coils are timely energized by the master output voltages $V^M_{out}$ to act on the permanent magnets and rotate the rotor, the shaft, and the master blades M-1220 at the master rotational speed $W^M$.

The master commutation system M-1300 is designed to identify evidence of at least the rotational frequency of the master fan blades M-1220. The evidence may be direct or indirect. In one example, the master commutation system M-1300 includes a position sensor, such as a Hall effect device. In another example, the master commutation system M-1300 indirectly senses rotational frequency based on electromagnetic forces generated by rotation of the master fan blades M-1220 by the master fan motor M-1210. For example, the master commutation system M-1300 may be designed to sense Back Electro-Motive Force (BEMF). In some implementations involving a DC motor including a stator with coils, in a particular example, the master commutation system M-1300 may be designed to capture the periodic energizing of the coils of the master fan motor M-1210 and to provide master current pulses $I^M$ indicative of the master rotational speed $W^M$. In further embodiments, the motor may include a built-in tachometer. For example, some brushless DC motors include built-in tachometers within the commutation circuit. The output of the tachometer may be used to synchronize rotation of the fan with additional slave fan(s). In a particular example, the tachometer output may be provided to the input of the phase lock loop C-1000.

The master current sensor M-1400 is designed to manipulate the evidence of at least the rotational frequency of the master fan blades M-1220 into a signal useful in driving the performance of the slave fan assembly S-1000. In some embodiments, the master current sensor M-1400 can be an electrical circuit configured to provide a wave signal, such as a square wave, characterized by the reference synchronization frequency $F^M$ and reference synchronization phase $\phi^M$. For example, the master current sensor $I^M$ can include a resistor and a comparator that are crossed by the master current pulses $I^M$. In another example, the master current sensor $I^M$ can include Hall effect sensors that are crossed by the master current pulses $I^M$.

The master regulator M-1100, in some implementations, is an electronic circuit configured to regulate (e.g. increase or decrease) voltages received from a DC source to output the master output voltages $V^M_{out}$ at values that are based on the input voltages $V_{in}$. The master regulator M-1100 may employ pulse width modulation (PWM) for regulating voltages. In one example, the master regulator M-1100 is a circuit with switching regulator topologies to maximize the efficiency of the master regulator M-1100 by minimizing power dissipation. For example, the master regulator M-1100 can have a Buck topology relying on frequency and phase comparators, diodes, capacitors, and inductors, as illustrated in FIG. 1B. The master regulator M-1100 may be designed, using a DC power source, for providing voltages higher than the master output voltages $V^M_{out}$ using a boost topology. In another example, the master regulator M-1100 may be designed to accept a DC power source and provide voltages lower than the master output voltages $V^M_{out}$. In a further Buck-boost topology example, the master regulator M-1100 for a DC power source may provide a minimum voltage higher than some low range voltages of the output voltages of the DC power source and a maximum voltage lower than some high range voltages of the output voltages.

The slave voltage controlled oscillator S-1000 can include a slave regulator S-1100 receiving a summation of the input voltages $V_{in}$ and the gain G, and providing slave output voltages $V^S_{out}$ to the slave fan S-1200. The slave fan S-1200 may, in turn, receive the slave output voltages $V^S_{out}$ and provide slave synchronization signals $S^S$. The slave fan S-1200, in some implementations, includes a slave fan motor S-1210 to receive the slave output voltages $V^S_{out}$ and to drive the slave blades S-1220 at a slave rotational speed $W^S$. The slave rotational speed $W^S$, in some embodiments, is substantially equal to the master rotational speed $W^M$. In other embodiments, the slave rotational speed $W^S$ is adjusted for the size of the slave blades S-1220.

In some implementations, a slave commutation system S-1300 provides slave current pulses $I^S$ to a slave current sensor S-1400. The slave current sensor S-1400 receives the slave current pulses $I^S$ and extracts a slave synchronization phase $\phi^S$ and a slave synchronization frequency $F^M$ as slave synchronization signals $S^S$. The slave synchronization frequency $F^M$ can be indicative of the slave rotational speed $W^S$ of the slave blades S-1220 (e.g., proportional to the slave rotational speed $W^S$).

In some embodiments, similar to the master fan motor M-1210, the slave fan motor S-1210 is an electrical motor, such as a DC brushed motor or a DC brushless motor. For example, the slave fan motor S-1210 can include a stator with coils, a rotor with permanent magnets driven by the coils of the stator, and a shaft affixed to the rotor and supporting the slave blades S-1220. The coils may be timely energized by the slave output voltages $V^S_{out}$ to act on the permanent magnets and to rotate the rotor, the shaft, and the slave blades S-1220 at the slave rotational speed $W^S$.

In some embodiments, similar to the master commutation system M-1300, the slave commutation system S-1300 is an electrical circuit configured to capture evidence of the rotational timing of the slave fan motor S-1210 and to provide the slave current pulses $I^S$ that are indicating of the slave rotational speed $W^S$. The evidence may be direct or indirect. In one example, the slave commutation system S-1300 includes a position sensor, such as a Hall effect device. In another example, slave commutation system S-1300 indirectly senses rotational frequency based on electromagnetic forces generated by rotation of the slave fan blades S-1220 by the slave fan motor S-1210. For example, the slave commutation system S-1300 may be designed to sense BEMF. In some implementations involving a DC motor including a stator with coils, in a particular example, the slave commutation system S-1300 may be designed to capture the periodic energizing of the coils of the slave fan motor S-1210 and to provide slave current pulses $I^S$ indicative of the slave rotational speed $W^S$. In further embodiments, the motor fan motor S-1210 may include a built-in tachometer. For example, some brushless DC motors include built-in tachometers within the commutation circuit. The output of the tachometer may be used to synchronize rotation of the fan with additional slave fan(s). In a particular example, the tachometer output may be provided to the input of the phase lock loop C-1000.

The slave regulator S-1100 can be an electronic circuit configured to regulate, e.g. increase or decrease, voltages received from a DC source to output the slave output voltages $V^S_{out}$ at values that are based on the input voltages $V_{in}$ adjusted by the gain G. The slave regulator S-1100 may employ pulse width modulation (PWM) for regulating voltages. In one example, the slave regulator S-1100 is a circuit with switching regulator topologies to maximize the efficiency of the slave regulator S-1100 by minimizing power dissipation. For example, the slave regulator S-1100 can have a Buck topology relying on frequency and phase comparators, diodes, capacitors, and inductors, as illustrated in FIG. 1B. The slave regulator S-1100 may be designed, using a DC power source, for providing voltages higher than the slave output voltages $V^S_{out}$ using a boost topology. In another example, the slave regulator S-1100 may be designed to accept a DC power source and to provide voltages lower than the slave output voltages $V^S_{out}$. In a further Buck-boost topology example, the slave regulator S-1100 for a DC power source may provide a minimum voltage higher than some low range voltages of the output voltages of the DC power source and a maximum voltage lower than some high range voltages of the output voltages.

In some embodiments, the master voltage controlled oscillator M-1000 and the slave voltage controlled oscillator S-1000 have different configurations to perform different functionalities from each other. For example, the master fan M-1200 can have predominant physical characteristics, e.g. the master blades M-1220 can be wider than the slave blades S-1220, to perform predominant tasks, e.g. cool major elements and/or parts of the electrical circuits 500 that prone to overheat, while the slave fan S-1200 can have subordinate physical characteristics, e.g., the slave blades S-1220 can be smaller than the master blades M-1220, to perform secondary tasks, e.g. cool minor elements and/or parts of the electrical circuits 500 that are not prone to overheat.

The phase lock loop C-1000, in some embodiments, includes a phase comparator C-1100 to receive the reference synchronization signals $S^M$ and the slave synchronization signals $S^S$, and to provide a phase comparator output $V_{PD}$. The phase lock loop C-1000 may include a low pass filter C-1200 to receive the phase comparator output $V_{PD}$ and to provide a low pass filter output $V_{LPF}$. The phase lock loop C-1000 may further include an amplifier C-1300 to receive the low pass filter output $V_{LPF}$ and to provide the gain G.

In some implementations, the phase comparator C-1100 compares the reference synchronization signals $S^M$ and the slave synchronization signals $S^S$ and adjusts (e.g. increases or decreases), the phase comparator output $V_{PD}$ based on a comparison between the reference synchronization signals $S^M$ and the slave synchronization signals $S^S$. For example, the phase comparator C-1100 can compare the slave synchronization frequency $F^S$ of the slave synchronization signals $S^S$ with the reference synchronization frequency $F^M$ of the reference synchronization signals $S^M$, and modulate the phase comparator output $V_{PD}$ based on a frequency difference between the slave synchronization frequency $F^S$ and the reference synchronization frequency $F^M$. The phase comparator output $V_{PD}$ can increase commensurably (e.g., proportionally) with the frequency difference when the slave frequency $F^S$ is higher than the reference frequency $F^M$ and decrease (e.g., proportionally) with the frequency difference when the slave frequency $F^S$ is lower than the reference frequency $F^M$.

In another example, the phase comparator C-1100 can compare the slave synchronization phase $\phi^S$ of the slave synchronization signals $S^S$ with the reference synchronization phase $\phi^M$ of the reference synchronization signals $S^M$, and adjust the phase comparator output $V_{PD}$ based on a phase difference between the slave synchronization phase $\phi^S$ and the reference synchronization phase $\phi^M$. The phase comparator output $V_{PD}$ can increase commensurably (e.g., proportionally) with the phase difference when the slave synchronization phase $\phi^S$ is higher than the reference synchronization phase $\phi^M$ and decrease (e.g., proportionally) with the phase difference when the slave synchronization phase $\phi^S$ is lower than the reference synchronization phase $\phi^M$.

In some embodiments, the low pass filter C-1200 can slow down and/or reduce time variations of the $V_{PD}$. For example, due to successive phase differences and/or frequency differences between the slave synchronization signal $S^S$ and the reference synchronization signal $S^M$, time variations of the $V_{PD}$ may occur. The low pass filter C-1200 may provide the low pass filter output $V_{LPF}$ with reduced time variations. In a particular example, the low pass filter C-1200 can be configured to act as an integrator and to provide the low pass filter output $V_{LPF}$ commensurate (e.g., proportional) with a time average of the phase comparator output $V_{PD}$. The low pass filter C-1200, in some embodiments, can have a topology relying on diodes, and/or capacitors, as illustrated in FIG. 1B. In other embodiments, the low pass filter C-1200 circuitry is built into a greater integrated circuit chip.

In some embodiments, the amplifier C-1300 adjusts the input voltages $V_{in}$ via the gain G that is commensurate (e.g., proportional) with the low pass filter output $V_{LPF}$. For example, the amplifier C-13000 can be a DC amplifier that acts as a DC gain stage on the input voltages $V_{in}$ to provide the gain G to the slave voltage controlled oscillator S-1000.

In some embodiments, the phase lock loop C-1000 and the slave voltage controlled oscillator S-1000 can act as a feedback loop on the gain G and the slave synchronization signals $S^S$ to reach and continuously maintain a lock state where the slave synchronization signals $S^S$ match the reference synchronization signal $S^M$ and the slave fan S-1200 is synchronized with the master fan M-1200. The phase lock loop C-1000 can receive the slave synchronization signals $S^S$ from the slave voltage controlled oscillator S-1000 and feed the gain G back to the slave voltage controlled oscillator S-1000 to modify the slave synchronization signals $S^S$ so as to reach the lock state. For example, the phase lock loop C-1000 via the phase comparator C-1100 may provide the phase comparator output $V_{PD}$, with the low pass filter C-1200 providing the low pass filter output $V_{LPF}$. The amplifier C-1300 can continuously adjust (e.g., continuously increase and/or decrease) the gain G depending on the reference synchronization frequency $F^M$ and the slave synchronization frequency $F^S$ to reach and maintain a frequency lock status between the slave fan S-1220 and the master fan M-1220. Frequency lock status is reached, for example, where there is substantial equalization between the reference synchronization frequency $F^M$ and the slave synchronization frequency $F^S$. Additionally, the lock state may involve the slave rotational speed $W^S$ being substantially equal to the master rotational speed $W^M$. For example, if the slave synchronization frequency $F^S$ goes above the reference synchronization frequency $F^M$. the phase comparator C-1100 may function to increase the phase comparator output $V_{PD}$. The increase of the phase comparator output $V_{PD}$ may, in turn, cause the low pass filter C-1200 to increase the low pass filter output $V_{LPF}$. The increase of the low pass filter output $V_{LPF}$ may thereby cause the amplifier C-1300 to increase the gain G. Finally, the increase of the gain G may cause the slave voltage controlled oscillator S-1000 to increase the slave synchronization frequency $F^S$ and to increase the slave rotational speed $W^S$ of the slave fan S-1200. Inversely, if the slave synchronization frequency $F^S$ falls below the reference synchronization frequency $F^M$, the phase comparator C-1100 may decrease the phase comparator output $V_{PD}$. The decrease of the phase comparator output $V_{PD}$ may cause the low pass filter C-1200 to decrease the low pass filter output $V_{LPF}$. The decrease of the low pass filter output $V_{LPF}$ may cause the amplifier C-1300 to decrease the gain G. Finally, the decrease of the gain G may cause the slave voltage controlled oscillator S-1000 to decrease the slave synchronization frequency $F^S$ and to decrease the slave rotational speed $W^S$ of the slave fan S-1200.

In another example, the phase lock loop C-1000, via the phase comparator C-1100, provides the phase comparator output $V_{PD}$, and the low pass filter C-1200 provides the low pass filter output $V_{LPF}$, thereby causing the amplifier C-1300 to continuously adjust (e.g., continuously increase and/or decrease), the gain G depending on the reference synchronization phase $\phi^M$ and the slave synchronization phase $\phi^S$ to reach and maintain a phase lock status between the slave fan S-1220 and the master fan M-1220. In phase lock status, for example, a difference between the reference synchronization phase $\phi^M$ and the slave synchronization phase $\phi^S$ is substantially equal to a predetermined phase angle. The predetermined phase angle can be selected to facilitate the design of the different elements of the control system 1000 and/or to prevent vibrations between the master fan M-1200 and the slave fan S-1200. For example, the predetermined phase angle can be substantially equal to 180° to avoid current spikes, thereby minimizing size requirements of electronic devices, such as capacitors and inductors, included within the circuitry to mitigate such current spikes.

For example, if the slave synchronization phase $\phi^S$ goes above the reference synchronization phase $\phi^M$, the phase comparator C-1100 may increase the phase comparator output $V_{PD}$. The increase of the phase comparator output $V_{PD}$ may cause the low pass filter C-1200 to increase the low pass filter output $V_{LPF}$. The increase of the low pass filter output $V_{LPF}$ may cause the amplifier C-1300 to increase the gain G. Finally, the increase of the gain G may cause the slave voltage controlled oscillator S-1000 to increase the slave synchronization phase $\phi^S$. Inversely, if the slave synchronization phase $\phi^S$ falls below the reference synchronization phase $\phi^M$, the phase comparator C-1100 may decrease the phase comparator output $V_{PD}$. The decrease of the phase comparator output $V_{PD}$ may cause the low pass filter C-1200 to decrease the low pass filter output $V_{LPF}$. The decrease of the low pass filter output $V_{LPF}$ may cause the amplifier C-1300 to decrease the gain G. Finally, the decrease of the gain G may cause the slave voltage controlled oscillator S-1000 to decrease the slave synchronization phase $\phi^S$.

Figure 2:
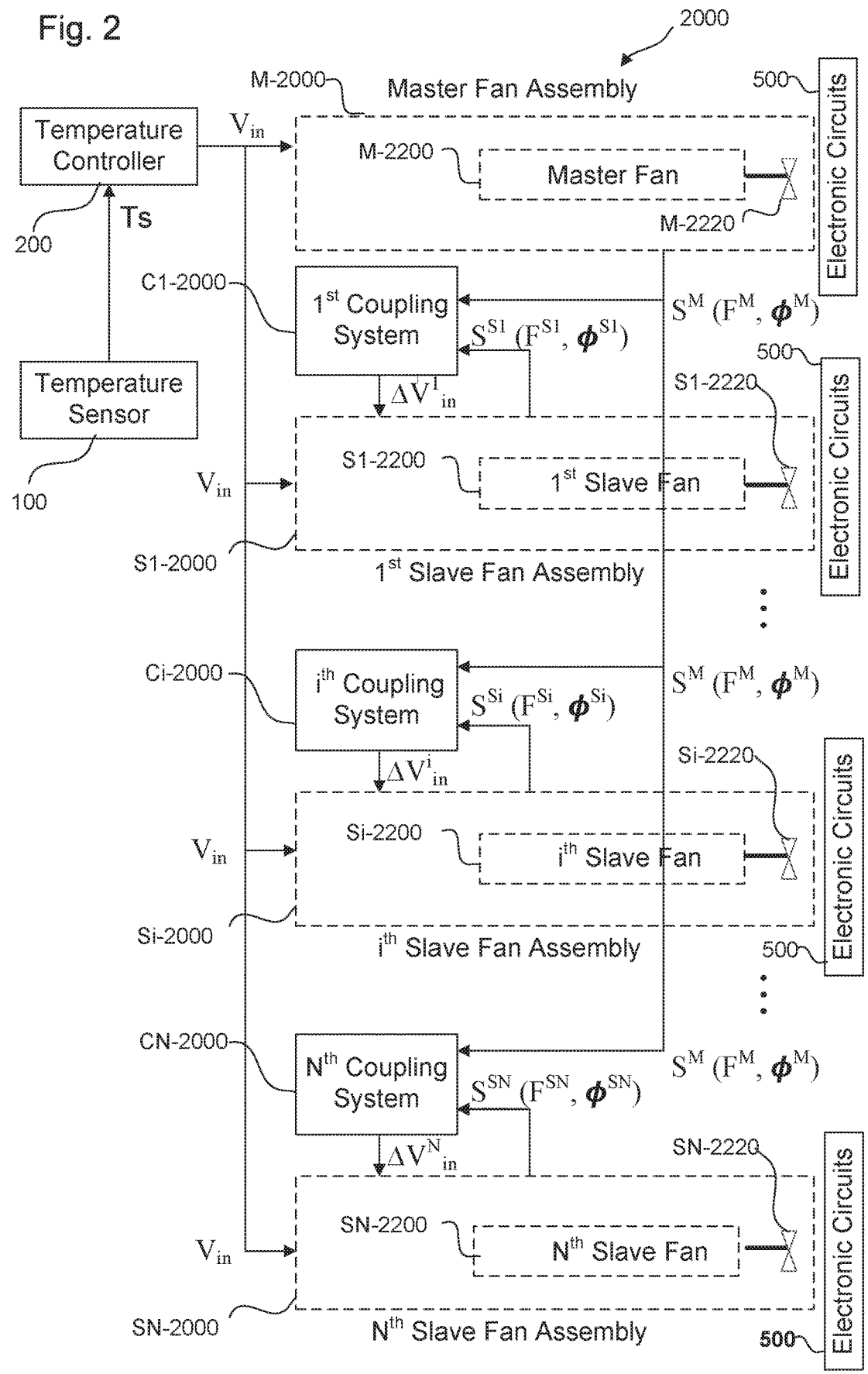
FIG. 2 is a flowchart of a method to synchronize the master fan and the slave fan, according to certain aspects of the disclosure.

Referring now to FIG. 2, a flow chart of a method 2000 for synchronizing one or more the slave fans with a master fan is illustrated. The method 2000, for example, may be performed by the control system 1000 of FIG. 1A.

In some embodiments, the method begins with determining an input voltage level for driving a master fan and generating the voltages (2002). The input voltage level, for example, may be established by the temperature controller 200 of FIG. 1A based on temperature signals Ts indicative of the ambient air temperatures T determined by the temperature sensor 100. The input voltage $V_{in}$, for example, can be generated by the temperature controller 200 of FIG. 1 to follow the predetermined temperature-voltage relationship between the input voltages $V_{in}$ and the ambient air temperature T. In an illustrative example, the predetermined temperature-voltage relationship can be such that if the ambient air temperature T is below a first predetermined minimum temperature threshold $T_0$ the temperature controller 200 can generate a substantially null voltage $V_0$ to not activate the master fan M-1200 and save energy and wear for the control system 1000. Further to the illustration, if the ambient air temperature T is above the first predetermined minimum temperature threshold $T_0$ and below a second predetermined minimum temperature threshold $T_{min}$ the temperature controller 200 can generate a minimum voltage $V_{in\ min}$ to minimize the speed of the rotational speed $W^M$ and to provide a low energy consumption cooling. Continuing with the illustration, if the ambient air temperature T is above a predetermined maximum temperature threshold $T_{max}$ the temperature controller 200 can generate a maximum voltage $V_{in\ max}$ to maximize the rotational speed $W^M$ of the master fan M-1200 and maximize cooling. Similarly, if the ambient air temperature T is above the second predetermined minimum temperature threshold $T_{min}$ and below the predetermined maximum temperature threshold $T_{max}$ the temperature controller 200 can generate input voltages $V_{in}$ that are proportional with the ambient air temperature T to provide commensurate cooling. For example, the first predetermined minimum temperature threshold $T_0$ can be between 10° C. and 30° C., and preferably between 15° C. and 25° C., the second predetermined minimum temperature threshold $T_{min}$ can be between 20° C. and 40° C., and preferably between 25° C. and 35° C., and the minimum voltage $V_{in\ min}$ can between 5V and 15V, and preferably between 7.5V and 12.5V, while the predetermined maximum temperature threshold $T_{max}$ can be between 40° C. and 60° C., and preferably between 45° C. and 55° C., and the maximum voltage $V_{in\ max}$ can between 15V and 25V, and preferably between 17.5V and 22.5V.

In some embodiments, the input voltages supplied to drive the master fan are regulated to provide commensurate cooling of the surrounding electronic circuitry (2004). For example, the input voltages $V_{in}$ can be regulated by the master Buck regulator M-1100 of FIG. 1A to provide the master output voltages $V^M_{out}$, while the master fan M-1200 is actuated by the master output voltages $V^M_{out}$ to rotate the master blades M-1220 at the master rotational speed $W^M$.

In some implementations, the reference synchronization signals $S^M$ characterizing the rotation of the blades of the master fan are provided by the master voltage controlled oscillator M-1000 (2006). For example, the master current pulses $I^M$ can be provided by the master commutation system M-1300 of FIG. 1A to the master current sensor M-1400, while the reference synchronization phase $\phi^M$ and the reference synchronization frequency $F^M$ of the reference synchronization signals $S^M$ can be provided by the master current sensor M-1400 to the phase lock loop C-1000. The reference synchronization frequency $F^M$ can be indicative of the master rotational speed $W^M$ of the master blades M-1220, e.g. proportional, while reference synchronization phase $\phi^M$ can be indicative of a phase angle of the master blades M-1220.

In some implementations, at least one slave fan is actuated by the input voltages $V_{in}$ adjusted by the gain G (2008). For example, the slave voltage controlled oscillator S-1000 of FIG. 1A may be actuated by the input voltages $V_{in}$ adjusted by the gain G to provide commensurate cooling of the electronic circuits 500 with the slave fan S-1200 synchronized with the master fan M-1200. For example, the input voltages $V_{in}$ adjusted by the gain G can be regulated by the slave Buck regulator S-1100 to provide the slave output voltages $V^S_{out}$, while the slave fan S-1200 is actuated by the slave output voltages $V^S_{out}$ to rotate the slave blades S-1220 at the slave rotational speed $W^S$.

In some embodiments, the slave voltage controlled oscillator S-1000 provides slave synchronization signals characterizing the rotation of the slave fan blades S-1220 (2010). For example, the slave current pulses $I^S$ can be provided by the slave commutation system S-1300 of FIG. 1A to the slave current sensor S-1400, while the slave synchronization phase $\phi^S$ and the slave synchronization frequency $F^S$ of the slave synchronization signals $S^M$ are provided by the master current sensor M-1400 to the phase lock loop C-1000. The slave synchronization frequency $F^S$ can be indicative of the slave rotational speed $W^S$ of the slave blades S-1220, e.g. proportional, while the slave synchronization phase $\phi^S$ can be indicative of a phase angle of the slave blades S-1220.

In some implementations, the synchronization between the slave fan(s) S-1200 and the master fan M-1200 can be measured via the phase lock loop C-1000 (2012). The measure of the synchronization between the slave fan(s) S-1200 and the master fan M-1200 can be performed by comparing the slave synchronization signals $S^S$ to the reference synchronization signals $S^M$ and by providing a synchronization difference output commensurate with a synchronization difference between the slave synchronization signals $S^S$ and the reference synchronization signals $S^M$ through the phase comparator C-1100 of the phase lock loop C-1000.

For example, the synchronization difference can be a speed difference between the slave rotational speed $W^S$ of the slave fan S-1200 and the master rotational speed $W^M$ of the master fan M-1200, while the synchronization difference can be the phase comparator output $V_{PD}$ provided by the phase comparator C-1100. For example, the phase comparator C-1100 can increase or decrease the phase comparator output $V_{PD}$ as the slave synchronization frequency $F^S$ increases or decreases in comparison to the master synchronization frequency $F^M$ or equivalently as the speed difference decreases or increases.

In another example, the synchronization difference can be a phase difference between the slave fan S-1200 and the master fan M-1200, while the synchronization difference can be the phase comparator output $V_{PD}$ provided by the phase comparator C-1100 that compares the slave synchronization phase $\phi^S$ to the master synchronization phase $\phi^M$. For example, the phase comparator C-1100 can increase or decrease the phase comparator output $V_{PD}$ as the slave synchronization phase $\phi^S$ increases or decreases in comparison to the master synchronization phase $\phi^M$ or equivalently as the phase difference decreases or increases.

In some embodiments, the gain G adjusting the voltages inputs $V_{in}$ for the slave fan(s) can be generated (2014). The generation of the gain G can be based on the measure of the synchronization between the slave fan(s) S-1200 and the master fan M-1200 performed through the phase lock loop C-1000.

For example, the generation of the gain G can be based on the phase comparator output $V_{PD}$, and performed through the low pass filter C-1200 and the amplifier C-1300 of the loop lock phase C-1000. The amplifier C-1300, through the low pass filter C-1200, can increase or decrease the gain G as the phase comparator input $V_{PD}$ increases or decreases.

In some implementations, the gain G adjusting the input voltages $V_{in}$ is used to drive the slave voltage controlled oscillator S-1000 (2008).

In some embodiments, the gain G can be adjusted by the loop lock phase C-1000 to reach and maintain a frequency lock status between the master fan M-1200 and the slave fan S-1200, e.g. equalization between the reference synchronization frequency $F^M$ and the slave synchronization frequency $F^S$. Once the frequency lock status is reached the gain G can be adjusted by the loop lock phase C-1000 to reach and maintain a phase lock status between the master fan M-1200 and the slave fan S-1200, e.g. equalization between the master synchronization phase $\phi^M$ and the slave synchronization frequency $\phi^S$.

Figure 3:
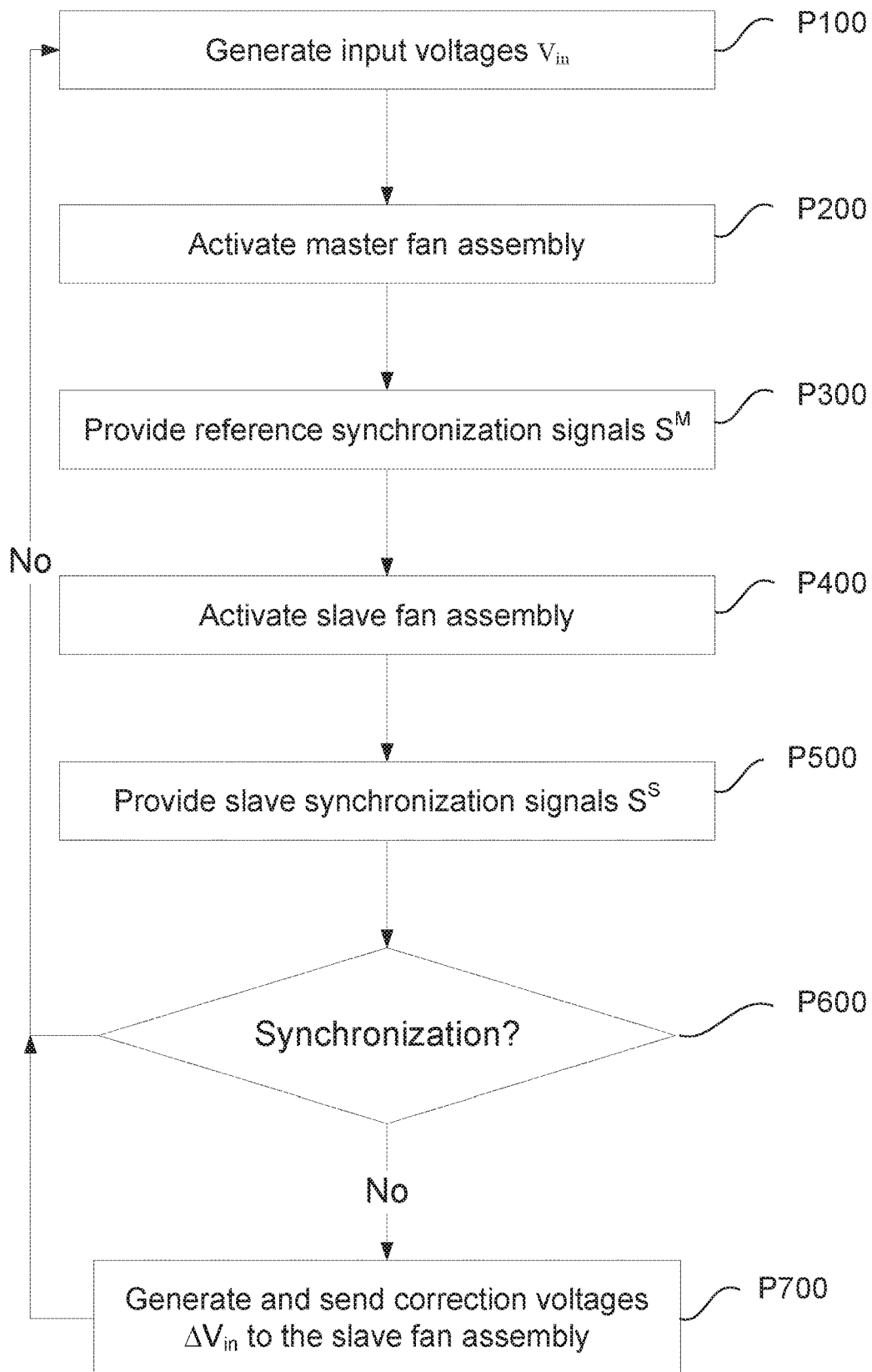
FIG. 3 is a schematic view of a control system to synchronize N slave fans to a master fan, according to certain aspects of the disclosure.

Referring now to FIG. 3, a control system 3000 to synchronize N slave fans $S_1$-2200 ... $S_i$-2200 ... $S_N$-2200 to a master fan M-2200 is illustrated. The control system 3000 can include a master voltage controlled oscillator M-3000 to receive input voltages $V_{in}$, to rotate master blades M-2220 of the master fan M-2200, and to provide reference synchronization signals $S^M$. The control system can further include N slave voltage controlled oscillators $S_1$-3000 ... $S_i$-3000 ... $S_N$-3000 to receive the input voltages $V_{in}$ adjusted by N gains $G^1$ ... $G^i$ ... $G^N$, and to rotate N slave blades $S_1$-2220 ... $S_i$-2220 ... $S_N$-2220 of the N slave fans $S_1$-2200 ... $S_i$-2200 ... $S_N$-2200 in synchronization with the master blades M-2220, and to provide N slave synchronization signals $S^{S1}$ ... $S^{Si}$ ... $S^{SN}$. Further, the control system 3000 may include N phase lock loops $C_1$-3000 ... $C_i$-3000 ... $C_N$-3000 to receive the reference synchronization signals $S^M$ and the N slave synchronization signals $S^{S1}$ ... $S^{SN}$ and to provide the N gains $G^1$ ... $G^N$.

In some embodiments, the control system 3000 synchronizes the N slave voltage controlled oscillators $S_1$-3000 ... $S_N$-3000 to the master voltage controlled oscillator M-3000 through a parallel structure. For example, the control system 3000 may synchronize each slave voltage controlled oscillator $S_i$-3000 to the master voltage controlled oscillator M-3000 through each phase lock loop $C_i$-3000 in a similar way as the one described in the previous embodiments illustrated in FIGS. 1A-1C. The parallel structure provides robustness in the control system 3000, by maintaining the N slave fans $S_1$-2200 ... $S_N$-2200 in synchronization with the master fan M-2200 even if some of the N slave voltage controlled oscillators $S_1$-3000 ... $S_N$-3000 fail and/or stop functioning. In some examples, one or more of the slave voltage controlled oscillators $S_1$-3000 ... $S_N$-3000 may fail or otherwise malfunction due to electrical failures, seized up motors, or burnt electrical elements. However, as discussed above, the remaining slave voltage controlled oscillators $S_1$-3000 ... $S_N$-3000 may continue to function. Additionally, despite loss of functionality in or failure of the master fan M-2200, the slave voltage controlled oscillators $S_1$-3000 ... $S_N$-3000 may continue to function through default voltage signals supplied by the temperature controller 200.

Each phase lock loop $C_i$-3000 can compare the reference synchronization signals $S^M$ with each slave synchronization signal $S^{Si}$ and can adjust each gain $G^i$ to match the reference synchronization signals $S^M$ with each slave synchronization signals $S^{Si}$. Matching the reference synchronization signals $S^M$ with the N slave synchronization signals $S^{S1}$ ... $S^{SN}$ can synchronize the rotation of the master blades M-2220 with the rotation of the N slave blades $S_1$-2220 ... $S_N$-2220 which in turn limits the level of noise generated. The reference synchronization signals $S^M$ can include a reference synchronization frequency $F^M$ and a reference synchronization phase $\phi^M$, while each slave synchronization signals $S^{Si}$ can include a slave synchronization frequency $F^{Si}$ and a slave synchronization phase $\phi^{Si}$.

In some embodiments, each gain $G^i$ can be adjusted based on the reference synchronization frequency $F^M$ and each slave synchronization frequency $F^{Si}$, via each phase lock loop $C_i$-3000. For example, each correction gain $G^i$ can be adjusted to maintain a frequency lock status between the master fan M-2200 and each slave fan $S_i$-2200, e.g. equalization between the reference synchronization frequency $F^M$ and each slave synchronization frequency $F^{Si}$.

In some embodiments, each gain $G^i$ is adjusted based on a relationship between the reference synchronization phase $\phi^M$ and each slave synchronization phase $\phi^{MSi}$, via each phase lock loop $C_i$-3000. For example, each gain $G^i$ can be adjusted to maintain a phase lock status between the master fan M-2200 and each slave fan $S_i$-2200, In illustration, differences between the reference synchronization phase $\phi^M$ and each slave synchronization phase $\phi^{MSi}$ are substantially equal to predetermined phase angles. The predetermined phase angle can be selected to facilitate the design of the different elements of the control system 3000. For example, the predetermined phase angles can be substantially equal to {120°, 240°} when the number N of the N slave fans $S_1$-2200 ... $S_N$-2200 is equal to 2; to {90°, 180°, 270°} when the number N of slave fans $S_1$-2200 ... $S_N$-2200 is equal to 3; to {72°, 144°, 216°, 288°} when the number N of slave fans $S_1$-2200 ... $S_N$-2200 is equal to 4.

The master voltage controlled oscillator M-3000, each slave voltage controlled oscillator $S_i$-3000, and each phase lock loop $C_i$-3000 can include electrical elements, such as diodes, capacitors, and inductors similar to the electrical elements of the master voltage controlled oscillator M-1000, the slave voltage controlled oscillator S-1000, and the phase lock loop C-1000 of the control system 1000 previously illustrated in FIGS. 1A-1B. Further, the master voltage controlled oscillator M-3000, each slave voltage controlled oscillator $S_i$-3000, and each phase lock loop $C_i$-3000 may have topologies (e.g. Buck, boost, etc.) that are similar to the topologies of the master voltage controlled oscillator M-1000, the slave voltage controlled oscillator S-1000, and the phase lock loop C-1000 of the control system 1000 previously illustrated in FIGS. 1A-1B.

Similar to the master voltage controlled oscillator M-1000 and the slave voltage controlled oscillator S-1000 illustrated in FIGS. 1A-1B, the master voltage controlled oscillator M-3000 and each slave assembly $S_i$-3000 can have different configurations to perform different functionalities from each other. For example, the master fan M-2200 can have predominant physical characteristics. For example, the master blades M-2220 can be wider than the slave blades S-1220 to perform predominant tasks such as cooling major elements and/or parts of the electrical circuit 500 that are prone to overheat. Each slave fan $S_i$-1200 can have subordinate physical characteristics. For example, each set of slave blades $S_i$-1220 can be smaller than the master blades M-2220. The slave fans, for example, may be designed to perform secondary tasks such as cooling minor elements and/or parts of the electrical circuit 500 that are not prone to overheat. In other embodiments, the master blades M-2220 and the slave blades slave blades $S_i$-1220 are similarly designed.

Further, in some implementations, multiple sets of master voltage controlled systems may be joined in a larger fan synchronization network. For example, an intermediate fan may act as both a slave fan (e.g., for a primary master fan) as well as a master fan (e.g., for additional slave fans allocated to this master fan. In this manner, for example, multiple server racks in a machine room may be synchronized. A primary fan may be designated in a primary server rack, where the primary fan is synchronized with a number of slave fans as described in relation to FIG. 3. Further, the primary fan may synchronize with "remote slave fans" which are master fans of additional server racks within the machine room. Each of these "remote slave fans" or "intermediate master fans" may in turn maintain synchronization with a number of slave fans local to each respective server rack. This topology is illustrated, for example, in a fan synchronization system 4000 of FIG. 4.

Figure 4:
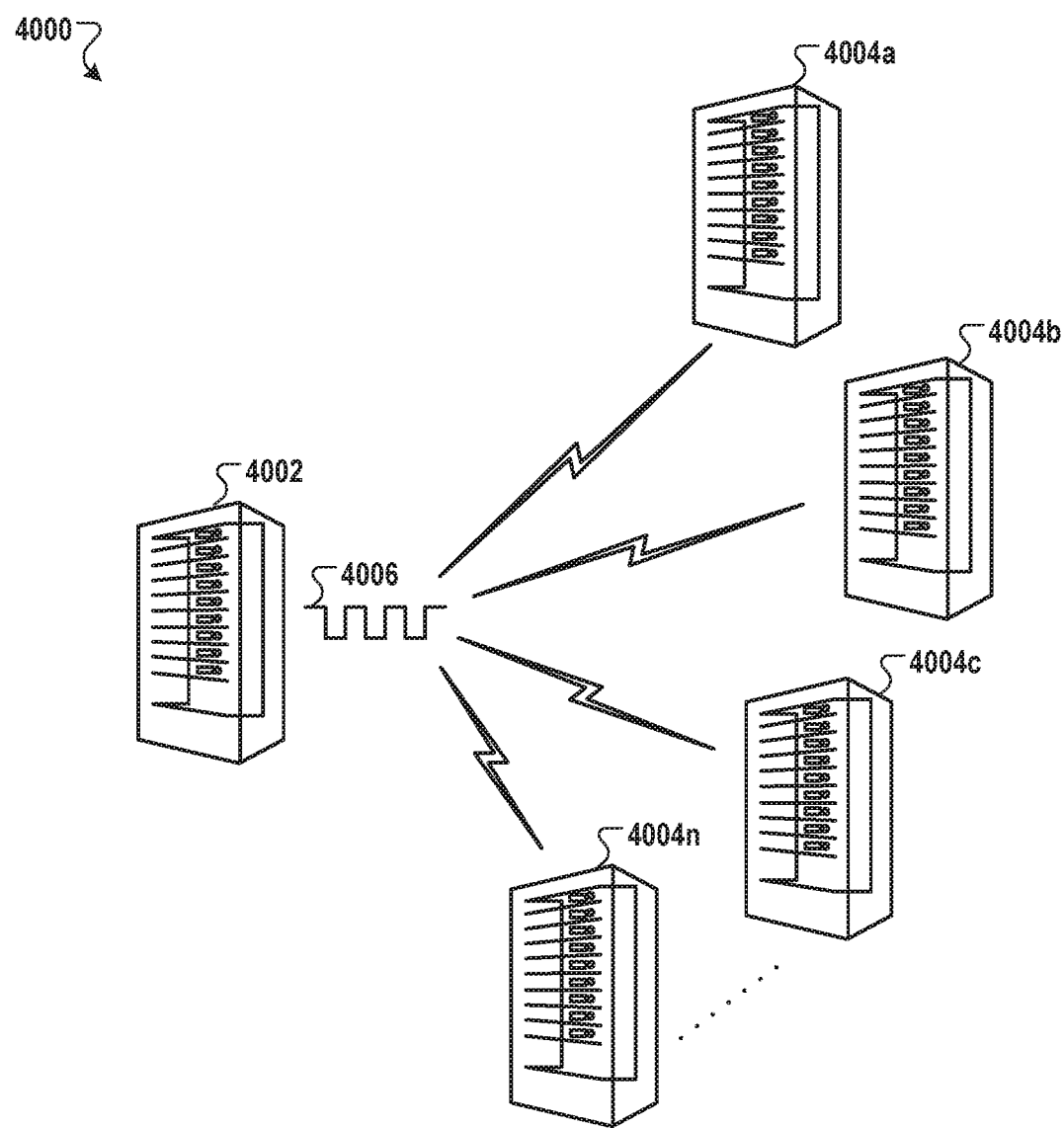
FIG. 4 is a block diagram of an example fan synchronization system for synchronizing multiple co-located control systems.

Turning to FIG. 4, a master server rack 4002 may include a wireless transmitter configured to transmit a master reference synchronization signal 4006 to a number slave server racks 4004a through 4004n. The master reference synchronization signal 4006, for example, can be a square wave signal with a frequency of the reference synchronization frequency $F^M$ and a phase of the reference synchronization phase $\phi^M$ of a primary fan synchronization system of the master server rack 4002. A reference voltage of the fan synchronization system of each slave server rack 4004a through 4004n, for example, may be modified based upon the incoming reference synchronization signal 4006 to synchronize the master fan of each of the slave server racks 4004a through 4004n with the master fan of the master server rack 4002.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A system to synchronize a slave fan to a master fan, the system comprising:
   a master voltage controlled oscillator configured to
      receive an input voltage at a master buck regulator,
      rotate master blades of the master fan pursuant to a voltage output from the master buck regulator, and
      provide reference synchronization signals;
   a slave voltage controlled oscillator configured to:
      receive the input voltage adjusted by one or more gain at a slave buck regulator,
      rotate slave blades of the slave fan at a slave fan speed pursuant to a voltage output from the slave buck regulator, and
      provide slave synchronization signals; and
   a phase lock loop configured to
      receive the reference synchronization signals and the slave synchronization signals,
      provide a comparison between the reference synchronization signals and the slave synchronization signals, and
      provide the one or more gain pursuant to the comparison between the reference synchronization signals and the slave synchronization signals, wherein the one or more gain modifies the input voltage to rotate the slave blades at the slave fan speed substantially equal to a master fan speed, wherein the reference synchronization signals include a reference synchronization frequency indicative of the master fan speed and the slave synchronization signals include a slave synchronization frequency indicative of the slave fan speed; wherein the master fan further includes a master commutation device configured to provide the reference synchronization signals to the phase lock loop by a master current sensor, wherein the master commutation device is configured to provide master current pulses and wherein the master current sensor is configured to extract the reference synchronization signals from the master current pulses, wherein the slave fan is configured as an intermediate master fan synchronized to one or more local slave fans.

2. The system of claim 1, further including:
   a temperature sensor to provide temperature signals indicative of an ambient air temperature; and
   a temperature controller configured to receive the temperature signals and provide the input voltage based in part on the temperature signals.

3. The system of claim 2, wherein the input voltage varies proportionally with ambient air temperature changes between a minimum voltage and a maximum voltage.

4. The system of claim 1, wherein the phase lock loop includes a phase comparator configured to:
   receive the reference synchronization frequency and the slave synchronization frequency; and
   provide a frequency comparison between the reference synchronization frequency and the slave synchronization frequency.

5. The system of claim 4, wherein the phase lock loop includes an amplifier configured to provide the one or more gain based on the frequency comparison to maintain a frequency lock status between the slave fan and the master fan.

6. The system of claim 1, wherein the reference synchronization signals include a reference synchronization phase indicative of a master phase of the master blades and the slave synchronization signals include a slave synchronization phase indicative of a slave phase of the slave blades.

7. The system of claim 6, wherein the phase lock loop includes a phase comparator configured to:
   receive the reference synchronization phase and the slave synchronization phase, and
   provide a phase difference between the reference synchronization phase and the slave synchronization phase.

8. The system of claim 7, wherein the phase lock loop includes an amplifier configured to provide the one or more gain based on the phase difference to maintain a phase lock status between the slave fan and the master fan.

9. The system of claim 8, wherein the phase difference is substantially equal to 90 degrees.

10. A system to synchronize a plurality of slave fans to a master fan, the system comprising:
   a temperature sensor and a temperature controller configured to provide input voltage pursuant to ambient air temperature;
   a master voltage controlled oscillator configured to:
      receive the input voltage at a master buck regulator,
      rotate master blades of the master fan at a master fan speed pursuant to a voltage output from the master buck regulator, and
      provide reference synchronization signals from the master fan;

a plurality of slave voltage controlled oscillators, wherein each slave voltage controlled oscillator of the plurality of slave voltage controlled oscillators is configured to:
receive the input voltage adjusted by a respective one or more gain at a respective slave buck regulator,
rotate respective slave blades of a respective slave fan of the plurality of slave fans pursuant to a voltage output from the respective slave buck regulator, and
provide respective slave synchronization signals from the respective slave fan; and a plurality of phase lock loops, wherein a respective phase lock loop of the plurality of phase lock loops is configured to:
receive the reference synchronization signals and the respective slave synchronization signals,
provide a comparison between the reference synchronization signals and the respective slave synchronization signals, and
provide the respective one or more gain pursuant to the comparison between the reference synchronization signals and the respective slave synchronization signals, wherein the respective one or more gain modifies the input voltage of the respective slave voltage controlled oscillator of the plurality of slave voltage controlled oscillators to rotate the respective slave blades at the respective slave fan speed substantially equal to the master fan speed; wherein the reference synchronization signals include a reference synchronization frequency indicative of the master fan speed and the respective slave synchronization signals include a respective slave synchronization frequency indicative of the respective slave fan speed, wherein the master fan further includes a master commutation device configured to provide the reference synchronization signals to the plurality of phase lock loops by a master current sensor, wherein the master commutation device is configured to provide master current pulses and wherein the master current sensor is configured to extract the reference synchronization signals from the master current pulses, wherein at least one slave fan of the plurality of slave fans is configured as an intermediate master fan synchronized to one or more local slave fans.

11. The system of claim 10, wherein each phase lock loop of the plurality of phase lock loops includes a respective phase comparator configured to:
receive the reference synchronization frequency and the respective slave synchronization frequency; and
provide a respective frequency comparison between the reference synchronization frequency and the respective slave synchronization frequency.

12. The system of claim 10, wherein each phase lock loop of the plurality of phase lock loops includes a respective amplifier configured to provide the respective gain based on the respective frequency comparison to maintain a respective frequency lock status between the respective slave fan and the master fan.

13. The system of claim 10, wherein the reference synchronization signals include a reference synchronization phase indicative of a master phase of the master blades and the respective slave synchronization signals include a respective slave synchronization phase indicative of a respective slave phase of the respective slave blades.

14. The system of claim 13, wherein each phase lock loop of the plurality of phase lock loops includes a respective phase comparator configured to:
receive the reference synchronization phase and the respective slave synchronization phase; and
provide a respective phase difference between the reference synchronization phase and the respective slave synchronization phase.

15. The system of claim 14, wherein each phase lock loop of the plurality of phase lock loops includes a respective amplifier configured to provide the respective gain based on the respective phase difference to maintain a respective phase lock status between the respective slave fan and the master fan.

16. The system of claim 15, wherein the plurality of slave fans is two slave fans and the respective phase difference is one of 120 degrees and 240 degree.

17. The system of claim 15, wherein the plurality of slave fans is three slave fans and the respective phase difference is one of 90 degrees, 180 degrees, and 270 degrees.

18. The system of claim 15, wherein the plurality of slave fans is four slave fans and the respective phase difference is one of 72 degrees, 144 degrees, 216 degrees, and 288 degrees.

* * * * *